US011061079B2

(12) United States Patent
Guo (10) Patent No.: US 11,061,079 B2
(45) Date of Patent: Jul. 13, 2021

(54) GROUNDING MONITORING SYSTEM, METHOD, DEVICE AND COMPUTER READABLE STORAGE MEDIUM

(71) Applicant: Shanxi Quan'an New Technology Development Co., Ltd., Jiexiu (CN)

(72) Inventor: Chunping Guo, Jiexiu (CN)

(73) Assignee: Shanxi Quan'an New Technology Development Co., Ltd., Shanxi (CN)

(*) Notice: Subject to any disclaimer, the term of this patent is extended or adjusted under 35 U.S.C. 154(b) by 122 days.

(21) Appl. No.: 16/481,246

(22) PCT Filed: Feb. 2, 2018

(86) PCT No.: PCT/CN2018/075020
§ 371 (c)(1),
(2) Date: Jul. 26, 2019

(87) PCT Pub. No.: WO2018/141259
PCT Pub. Date: Aug. 9, 2018

(65) Prior Publication Data
US 2019/0377022 A1 Dec. 12, 2019

(30) Foreign Application Priority Data
Feb. 4, 2017 (CN) .......................... 201710064001.6

(51) Int. Cl.
*G01R 31/14* (2006.01)
*G01R 31/52* (2020.01)
*G01R 27/20* (2006.01)

(52) U.S. Cl.
CPC ............. *G01R 31/52* (2020.01); *G01R 27/20* (2013.01)

(58) Field of Classification Search
CPC ........ G01R 27/02; G01R 27/08; G01R 27/18; G01R 27/20; G01R 31/006; G01R 31/025; G01R 31/14; G01R 31/50; G01R 31/52
See application file for complete search history.

(56) References Cited

U.S. PATENT DOCUMENTS 6,265,881 B1* 7/2001 Meliopoulos .......... G01R 27/20
324/347
2009/0096464 A1* 4/2009 Tanaka .............. H01M 8/04567
324/551
(Continued)

FOREIGN PATENT DOCUMENTS

CN 86201128 U 3/1988
CN 202256507 U 5/2012
(Continued)

OTHER PUBLICATIONS

International Search Report dated Apr. 28, 2018, in the International Application: PCT/CN2018/075020, 3 pages.

*Primary Examiner* — Thang X Le
(74) *Attorney, Agent, or Firm* — Wilmer Cutler Pickering Hale and Dorr LLP (57) ABSTRACT

The present disclosure relates to a grounding monitoring device, method, system and computer readable storage medium, which relates to the field of coal mine safety. The device includes: a measurement power source for supplying power to the grounding monitoring device; a resistance measurement device connected between the measurement power source and a grounding electrode, the resistance measurement device, the measurement power source and the grounding electrode forming a current detection circuit via the ground, wherein a resistance of a grounding resistor is
(Continued)

determined according to a current flowing through the grounding electrode in the current detection circuit to determine a monitoring result.

19 Claims, 4 Drawing Sheets

(56) References Cited

U.S. PATENT DOCUMENTS

| | | | | |
|---|---|---|---|---|
| 2015/0204937 A1* | 7/2015 | Lehr | ................. | G01R 31/1272 |
| | | | | 324/551 |
| 2015/0285851 A1* | 10/2015 | Kawamura | ........... | B60L 3/0069 |
| | | | | 324/509 |
| 2019/0067931 A1* | 2/2019 | Li | ........................... | H02H 3/16 |

FOREIGN PATENT DOCUMENTS

| | | | |
|---|---|---|---|
| CN | 204731317 U | | 10/2015 |
| CN | 204789848 U | | 11/2015 |
| CN | 106707087 A | | 5/2017 |
| CN | 206818822 U | | 12/2017 |
| EP | 2189799 A1 | | 5/2010 |
| JP | 3652852 | * | 4/1999 |
| JP | 2009-216599 A | | 9/2009 |
| JP | 2014-153324 A | | 8/2014 |
| JP | 2014153324 | * | 8/2014 |
| JP | 2014-169999 A | | 9/2014 |

* cited by examiner

GROUNDING MONITORING SYSTEM, METHOD, DEVICE AND COMPUTER READABLE STORAGE MEDIUM

CROSS-REFERENCE TO RELATED APPLICATIONS

This application is a United States national phase application of International Patent Application No. PCT/CN2018/075020, filed Feb. 2, 2018, which claims priority to Chinese application for invention 201710064001.6, filed on Feb. 4, 2017, the disclosure of which is hereby incorporated into this application by reference in its entirety.

TECHNICAL FIELD

The present disclosure relates to the field of coal mine safety, and in particular to a grounding monitoring system, a grounding monitoring method, a grounding monitoring device, and a computer readable storage medium.

BACKGROUND

As stipulated in Section 6 Chapter 10 of Safety Regulations for Coal Mines, underground electrical equipment must have grounding protection, a leakage protection device must be mounted on the underground and leakage tripping tests must be conducted regularly. As stipulated in Three Protection Rules for Power Supply in Underground Coal Mines, the grounding resistance should be measured once a quarter with a grounding tramegger, and at least one remote leakage test must be conducted every month. Therefore, a grounding electrode is typically used for grounding protection. Also, a grounding electrode is typically used for testing a leakage detecting relay.

The grounding test device in the related art typically comprises a time-delay resistor and an experiment button.

SUMMARY

According to some embodiments of the present disclosure, a grounding monitoring device is provided, comprising: a measurement power source for supplying power to the grounding monitoring device; a resistance measurement device connected between the measurement power source and a grounding electrode, wherein the resistance measurement device, the measurement power source and the grounding electrode form a current detection circuit via the ground, and wherein a resistance of a grounding resistor is determined according to a current flowing through the grounding electrode in the current detection circuit to determine a monitoring result.

In some embodiments, the grounding monitoring device transmits the monitoring result comprising the resistance of the grounding resistor to a monitoring protection facility.

In some embodiments, the device further comprises a processor for determining whether the grounding electrode is reliably grounded according to the resistance of the grounding resistor or the current flowing through the grounding electrode determined by the resistance measurement device, wherein the processor generates an alarm signal or a power-off signal for transmission to a monitoring protection facility, if it is determined that the grounding electrode is not reliably grounded.

In some embodiments, the device further comprises an operation mechanism connected between the measurement power source and the resistance measurement device, wherein a normally closed contact of the operation mechanism is connected to a power supply circuit of a grounding test device for performing power on or off control on the power supply circuit of the grounding test device.

In some embodiments, if the processor determines that the grounding electrode is not reliably grounded, the processor disconnects the power supply circuit of the grounding test device by disconnecting the normally closed contact of the operation mechanism.

In some embodiments, the grounding electrode is a tubular grounding electrode or a ground plate; the measurement power source and the resistance measurement device are mounted in a hollow portion of the tubular grounding electrode, or outside the tubular grounding electrode, or on the exterior of the ground plate.

In some embodiments, the measurement power source, the operation mechanism, and the resistance measurement device are encapsulated by an insulating material.

According to some other embodiments of the present disclosure, a grounding monitoring method is provided, comprising: connecting a resistance measurement device to a measurement power source and a grounding electrode, wherein the measurement power source, the resistance measurement device and the grounding electrode form a current detection circuit via the ground; determining a resistance of a grounding resistor to determine a monitoring result through monitoring a current flowing through the grounding electrode in the current detection circuit by the resistance measurement device.

In some embodiments, transmitting the monitoring result including the resistance of a grounding resistor to a monitoring protection facility.

In some embodiments, the grounding electrode is a tubular grounding electrode or a ground plate, the measurement power source and the resistance measurement device are mounted in a hollow portion of the tubular grounding electrode or outside the tubular grounding electrode, or are mounted on the exterior of the ground plate.

In some embodiments, determining whether the grounding electrode is reliably grounded according to the resistance of the grounding resistor or the current flowing through the grounding electrode; wherein an alarm signal or a power-down signal is generated for transmission to a monitoring protection facility, if it is determined that the grounding electrode is not reliably grounded.

In some embodiments, if it is determined that the grounding electrode is not reliably grounded, disconnecting a power supply circuit of a grounding test device by disconnecting a normally closed contact of an operation mechanism, the normally closed contact of the operation mechanism being connected to the power supply circuit of the grounding test device in series.

In some embodiments, the measurement power source, the operation mechanism, and the resistance measurement device are encapsulated by an insulating material.

According to still other embodiments of the present disclosure, a grounding monitoring device, comprising: memory; a processor coupled to the memory, the processor configured to, based on instructions stored in the memory, carry out the grounding monitoring method according to any one of the embodiments.

According to still further embodiments of the present disclosure, there is provided a computer readable storage medium having stored thereon a computer program that, when executed by a processor, implements the grounding monitoring method according to any of the embodiments.

According to still further embodiments of the present disclosure, a grounding monitoring system, comprising: a grounding electrode; and a grounding monitoring device according to any one of the above embodiments.

The other features of this disclosure and their advantages will become clear through a detailed description of the exemplary embodiments of this disclosure with reference to the accompanying drawings below.

BRIEF DESCRIPTION OF THE DRAWINGS

The accompanying drawings which constitute a part of the specification describe the embodiments of this disclosure, and together with the description, serve to explain the principle of this disclosure.

This disclosure can be understood more clearly with reference to the accompanying drawings according to the following detailed description, in which.

It should be noted that, the dimensions of the parts shown in the accompanying drawings are not drawn in accordance with actual proportional relationships. In addition, identical or similar reference numerals represent identical or similar composite parts.

DETAILED DESCRIPTION

The various exemplary embodiments of this disclosure are now described in detail with reference to the accompanying drawings. The description of the exemplary embodiment is merely illustrative and by no means serves as any restriction to this disclosure and its application or use. This disclosure can be implemented in many different forms and is not limited to the embodiments described here. These embodiments are provided in order to make this disclosure thorough and complete, and to fully express the scope of this disclosure to a person skilled in the art. It should be noted that, unless otherwise specified, the relative arrangements of the components and steps described in these embodiments should be interpreted as merely illustrative but not restrictive.

All terms (including technical terms or scientific terms) that are used in this disclosure have the same meanings as those understood by a person of ordinary skill in the field to which this disclosure pertains, unless otherwise specifically defined. It should also be understood that, terms defined in common dictionaries should be interpreted as having meanings consistent with their meanings in the context of the related technologies, rather than being interpreted in an idealized or extremely formalized sense, unless expressly defined here.

The technologies, methods and apparatuses known to those skilled in the related fields may not be discussed in detail, but where appropriate, the techniques, methods and apparatuses should be considered as part of the specification.

The inventors of the present disclosure have found the following problems existed in the above-mentioned related art. That is, if the grounding electrode is completely exposed outside the coal seam rather than appropriately buried in the coal seam as specified by the regulations, the grounding resistance will greatly increase, that is, a floating grounding electrode is present, which thereby results in "electric sparks" occurred on the grounding electrode and may cause gas/coal dust explosion or electric shock. In view of the above problems, the present disclosure provides a grounding monitoring solution capable of improving the reliability of grounding safety.

Figure 1:
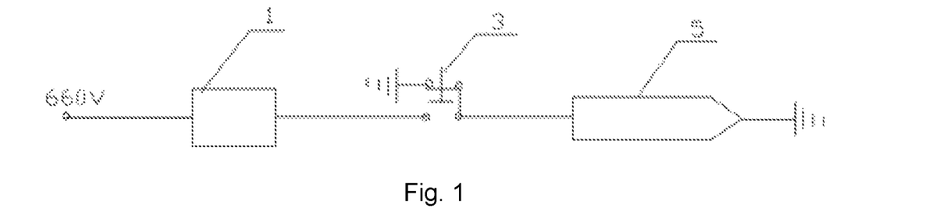
FIG. 1 is a schematic block diagram showing the principle of grounding test provided in the related art.

FIG. 1 is a schematic block diagram showing the principle of grounding test provided in the related art.

As shown in FIG. 1, the grounding test device comprises a test resistor 1, a test button 3, and a grounding electrode 5. If the test button 3 is pressed when the grounding electrode is floating to test the reliability of leakage operation, a 660V voltage will be introduced to the grounding electrode 5 through a normally open contact of the test button 3 via the test resistor 1, and "electric sparks" may appear on the floating grounding electrode 5, thereby causing gas/coal dust explosion or electric shock.

In view of the technical problem existing in the related art, the inventors of the present disclosure have found that it can be solved by float locking of the grounding electrode and real-time online monitoring of the grounding condition. Float locking of the grounding electrode means that when the grounding electrode is floating, a non-intrinsically safe voltage is not transmitted to the grounding electrode, or the power supply of the equipment protected by the grounding electrode is cut off, and an alarm signal is issued when necessary to ensure safety and reliability.

Figure 2:
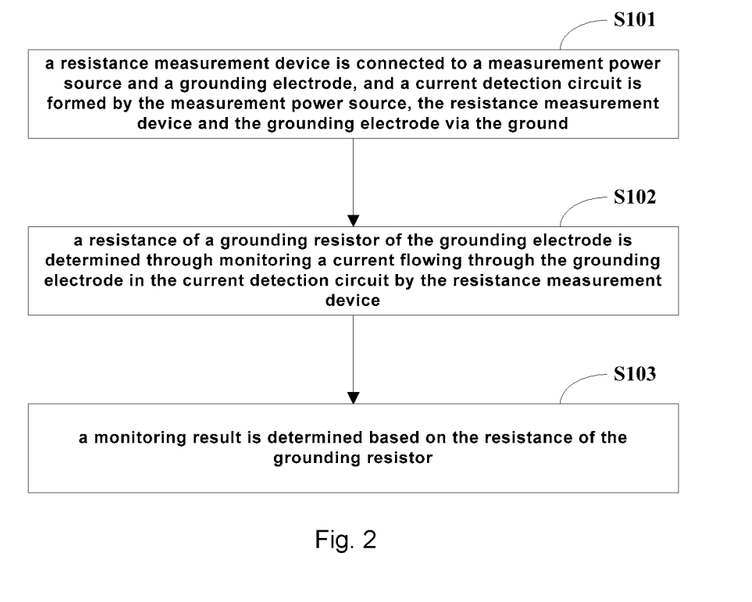
FIG. 2 illustrates an exemplary flow chart of a grounding monitoring method of some embodiments of the present disclosure.

FIG. 2 illustrates an exemplary flow chart of a grounding monitoring method of some embodiments of the present disclosure.

As shown in FIG. 2, the method comprises steps S101-S103.

In step S101, a resistance measurement device is connected to a measurement power source and a grounding electrode, and a current detection circuit (loop) is formed by the measurement power source, the resistance measurement device and the grounding electrode via the ground. For example, the grounding electrode may be a tubular grounding electrode, and the grounding monitoring device is mounted in a hollow portion of the tubular grounding electrode or outside the tubular grounding electrode. The grounding electrode may be a ground plate, and the grounding monitoring device may be mounted on the exterior of the ground plate.

In step S102, a resistance of a grounding resistor of the grounding electrode is determined through monitoring a current flowing through the grounding electrode in the current detection circuit by the resistance measurement device.

In step S103, a monitoring result is determined based on the resistance of the grounding resistor. For example, the monitoring result including the resistance of the grounding resistor may be further transmitted to a monitoring protection facility.

The monitoring result may further include an alarm signal or a power-down signal. For example, whether the grounding electrode is reliably grounded may be determined according to the resistance of the grounding resistor or the current flowing through the grounding electrode. If it is determined that the grounding electrode is not reliably grounded, an alarm signal or a power-down signal is generated and transmitted to an underground or overground monitoring protection facility.

In some embodiments, the resistance of the grounding resistor is compared with a preset resistance threshold, and it is determined whether the grounding electrode is reliably grounded based on the comparison result. For example, if the resistance is greater than the preset resistance threshold, it indicates that the grounding electrode is floating or is not appropriately grounded. In this case, it is determined that the grounding electrode is not grounded reliably, and an alarm or power-down signal is generated and transmitted to an underground or the overground monitoring protection facility.

In some embodiments, the current flowing through the grounding electrode is compared with a preset current threshold, and it is determined whether the grounding electrode is reliably grounded based on the comparison result. For example, if the current is less than the preset current threshold, it indicates that the grounding electrode is floating or not appropriately grounded. In this case, it is determined that the grounding electrode is not grounded reliably, and the resistance measurement device generates an alarm or power-down signal and transmits it to an underground or the overground monitoring protection facility.

In some embodiments, an operation mechanism may also be provided in the grounding test device, with a contact of the operation mechanism connected in series in the power supply circuit of the grounding test device. When an alarm signal or a power-down signal is generated and transmitted to the underground or the overground monitoring protection facility, power on or off control can be further performed on a leakage test device of the underground electrical equipment with the operation mechanism. For example, if the grounding electrode is floating, the path between the 660V power source of the leakage test device and the grounding electrode is disconnected by the operation mechanism. For example, the operation mechanism may be a relay. The contact of the relay may be connected in series in the power supply circuit of the leakage test device, and the power supply circuit of the leakage test device is disconnected by disconnecting the contact.

In some embodiments, the contact can be connected in series between the test resistor 1 and the test button 3 shown in FIG. 1. The path between the 660V power source and the grounding electrode is reliably cut off by disconnecting the contact. Thus, when the test button 3 is pressed to close the normally open contact to test the reliability of leakage protection operation, it is possible to avoid the "electric sparks" caused by a 660V voltage applied to the grounding electrode through the test resistor 1, the contact, and the normally open contact of the test button 3, thus eliminating the hidden danger of gas or coal dust explosion or electric shock.

In some embodiments, the measurement power source, the operation mechanism, and the resistance measurement device may be encapsulated with an insulating material.

In some embodiments, a current-in or current-out detection line of the grounding monitoring device may cause a short circuit with a metal casing of the grounding electrode.

In some embodiments, a current-flowing into or out from the detection line of the grounding monitoring device may cause a short circuit by passing a metal casing of the grounding electrode.

In order to avoid a short circuit, a short circuit protection device can be fixed on the metal casing of the grounding electrode or on its inclined surface. For example, the short circuit protection device comprises an intermediate conductor and an insulator disposed around the intermediate conductor, the intermediate conductor being connected to the current-out or current-in detection line.

In the above embodiment, the technical solution of the present disclosure can perform real-time online monitoring of the grounding resistance of the grounding electrode, and is suitable for online real-time monitoring of the grounding resistance in coal mines and other application scenarios, capable of realizing power-down locking and/or alarm in the event of unreliable grounding, and thereby effectively improving the grounding reliability of the grounding electrode.

An embodiment of the present disclosure further provides a grounding monitoring device, comprising a measurement power source and a resistance measurement device mounted inside or outside a grounding electrode, as further described in conjunction with FIGS. 3 to 7.

Figure 3:
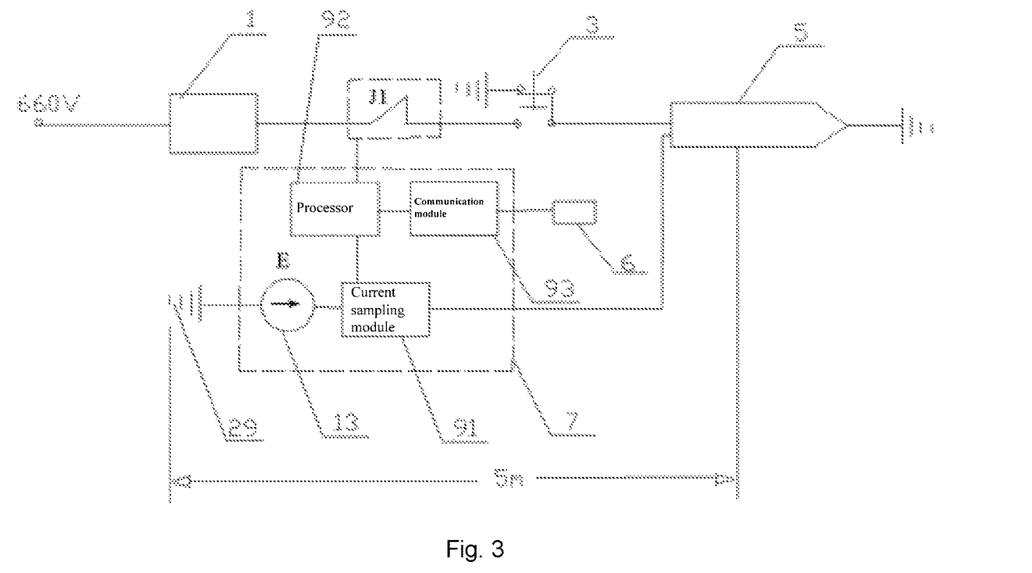
FIG. 3 illustrates a schematic block diagram of a grounding monitoring device of some embodiments of the present disclosure.

FIG. 3 illustrates a schematic block diagram of a grounding monitoring device of some embodiments of the present disclosure.

FIG. 3 shows a leakage test device and a grounding monitoring device 7 of underground electrical equipment. The leakage test device comprises a 660V power supply voltage, a test resistor 1, a contact J1, a test button 3, and a tubular local auxiliary grounding electrode 5. The grounding monitoring device 7 comprises a measurement power source 13, a current sampling module 91, and a processor 92. A grounding monitoring system can comprise the grounding monitoring device 7 and the grounding electrode 5. In some embodiments, the grounding monitoring device 7 may further comprise a communication module 93.

One terminal of the measurement power source 13 is connected to the grounding electrode 29. The grounding electrode 29 may be a primary grounding electrode of a leakage protection device, a local grounding electrode of other equipment, a grounding grid or a dedicated grounding electrode for measuring the grounding resistance. The other terminal of the measurement power source 13 is connected to the grounding electrode 5 via the current sampling module 91, so that the measurement power source 13, the current sampling module 91 and the grounding electrode 5 form a current detection circuit via the ground. That is, a current flowing out of the measurement power source 13 sequentially passes through the current sampling module 91, the grounding electrode 5, the ground, and the grounding electrode 29, and returns to the measurement power source 13.

The current sampling module 91 is equivalent to a resistance measurement device. The processor 92 acquires the magnitude of the current in the current detection circuit in real time by using the current sampling module 91, and determines the grounding resistance of the grounding electrode 5 according to the current magnitude. The processor 92 may further report the resistance value and the relay action status to a monitoring protection facility 6, such as an overground monitoring center, through the communication module 93.

In some embodiments, processor 92 can determine whether grounding electrode 5 is floating based on the magnitude of the current and/or the value of the grounding resistance. If it is determined that the grounding electrode 5 is floating, an alarm or power-down signal is generated and reported to the monitoring protection facility 6 through the communication module 93. Through disconnecting the contact J1 of the relay, the processor 92 may further prevent a 660V voltage from being applied to the floating grounding electrode 5 through the test resistor 1, the contact J1, and the test button 3, thereby eliminating the hidden danger of producing "electric sparks", so that the reliability of underground safety is improved.

In some embodiments, the grounding monitoring device may further comprise an operation mechanism. The contact of the operation mechanism may be the contact J1 of the relay. For example, the contact J1 may be a normally closed contact or a normally open contact.

Figure 4:
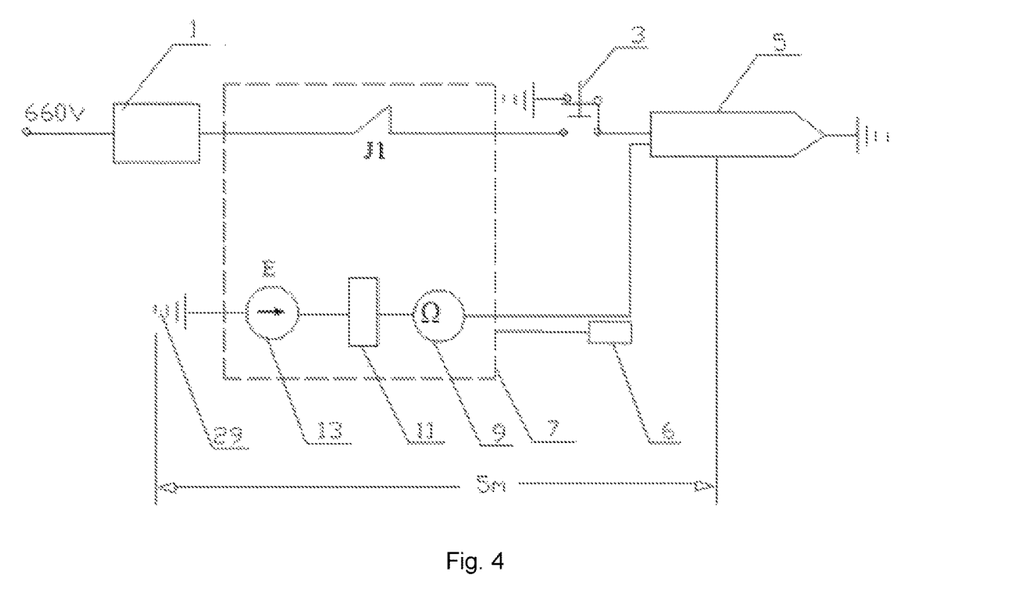
FIG. 4 illustrates a schematic block diagram of a grounding monitoring device of some other embodiments of the present disclosure.

FIG. 4 illustrates a schematic block diagram of a grounding monitoring device of some other embodiments of the present disclosure.

As shown in FIG. 4, the grounding test device 7 comprises a measurement power source 13 and a resistance measurement device 9. The grounding monitoring device 7 and the grounding electrode 5 may constitute a grounding monitoring system. In some embodiments, the grounding monitoring device 7 may further comprise a relay 11. One terminal of the measurement power source 13 is grounded, and the other terminal may be connected to the resistance measurement device 9, or may be connected to the relay 11 and then connected to the resistance measurement device 9. The resistance measurement device 9 may be connected to the tubular local grounding electrode 5. The relay 11 can be an electronic relay with a wired or wireless output. The resistance measurement device 9 may be a pointer type ohmmeter, or may be a digital resistance measuring meter that transmits measurement values in a wired or wireless transmission manner.

In some embodiments, a detection current out of the measurement power source 13 flows into the tubular local grounding electrode 5 through the relay 11 and the resistance measurement device 9, and returns back to the measurement power source 13 via the ground. The resistance measurement device 9 determines the value of the grounding resistance of the tubular local grounding electrode 5 according to the magnitude of the current, and displays it on the meter head or transmits it to the monitoring protection facility 6 (for example, an overground monitoring center) in a wired or wireless manner. When the grounding resistance of the grounding electrode 5 reaches a certain value (for example, if the grounding electrode is floating and the grounding resistance exceeds a certain specified value), the contact J1 is disconnected. For example, the relay 11 can cut off the path from the 660V power source to the test button 3 through the test resistor 1 by releasing (i.e., disconnecting) the contact J1. When the test button 3 is pressed, the grounding electrode 5 is disconnected to the 660V power source, so that the 660V power supply voltage cannot be applied to the floated grounding electrode, ensuring that the grounding electrode 5 is also safe and reliable when it is not grounded, without causing an accident caused by 660V "electric sparks". In this way, float locking of the grounding electrode 5 is achieved and the monitoring protection facility 6 can obtain an alarm signal indicating that the grounding electrode 5 is floating. The monitoring protection facility 6 may be various general monitoring systems, and the measurement power source 13 may be a general intrinsic safe power source. The contact J1 of the relay may be a normally closed contact or a normally open contact.

Figure 5:
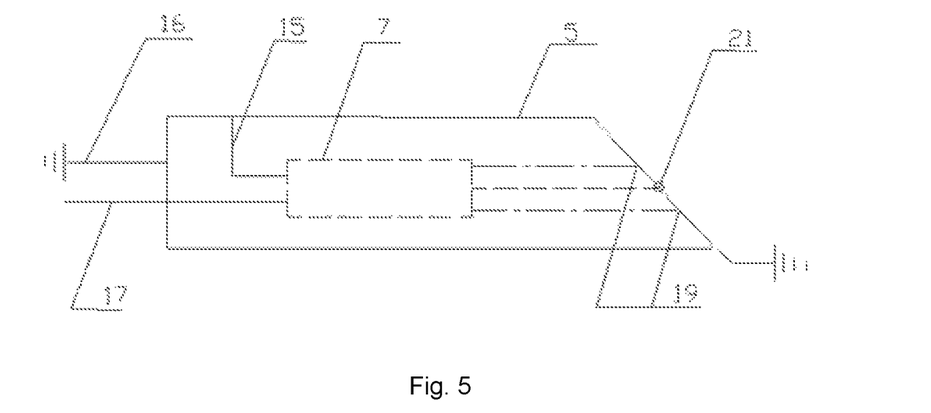
FIG. 5 illustrates a schematic block diagram of a grounding monitoring device mounted in a tubular grounding electrode of some embodiments of the present disclosure.
Figure 6:
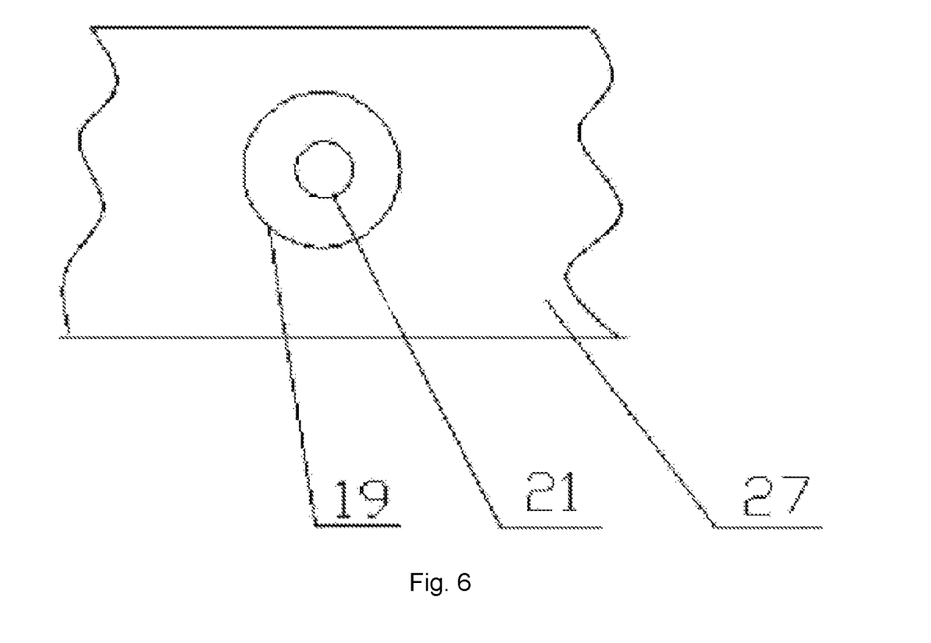
FIG. 6 illustrates, in the form of a right side view, a schematic block diagram of a grounding monitoring device mounted in a tubular grounding electrode of some embodiments of the present disclosure.

In some embodiments, the grounding monitoring device of the present disclosure may be mounted in the interior of the tubular grounding electrode as shown in FIGS. 5 and 6.

FIG. 5 illustrates a schematic block diagram of a grounding monitoring device mounted in a tubular grounding electrode of some embodiments of the present disclosure.

As shown in FIG. 5, the grounding monitoring device 7 is mounted in the tube of the tubular local auxiliary grounding electrode 5. A current flowing out of the grounding monitoring device 7 from a detection line (current flow-out detection line) 15 returns to the grounding monitoring device 7 through a wire 21 of a current flow-in line via the ground.

In some embodiments, The tubular local auxiliary grounding electrode 5 comprises insulator 19 and is grounding via grounding electrode 16.

In some embodiments, the current flowing out of the grounding monitoring device 7 mounted in the tubular grounding electrode and into the ground through the detection line 15 and then returning to the wire 21 will greatly reduce, and the measured grounding resistance will increase, if the grounding electrode 5 is floating or the grounding is unreliable. The relay in the grounding monitoring device 7 operates to disconnect the power supply path of the leakage test device. An alarm or power-down signal may be further output to a monitoring protection facility through the signal output line 17 in a wired or wireless manner. In this way, real-time online monitoring of whether the grounding electrode is floating can be achieved, and an alarm can be issued or the power of the device where the grounding electrode is located can be cut off when necessary.

FIG. 6 illustrates, in the form of a right side view, a schematic block diagram of a grounding monitoring device mounted in a tubular grounding electrode of some embodiments of the present disclosure.

FIG. 6 as a right-side view of the grounding electrode 5 shows that the grounding monitoring device is mounted on a metal casing of the grounding electrode 5 or on an inclined surface 27 of the grounding electrode, surrounded by an insulator 19, an intermediate conductor thereof being connected to the wire 21 of the detection line. It is also possible to take out an insulated wire, as shown in FIG. 6, and fix it on the metal casing of the grounding electrode. The function of the insulator 19 shown in FIG. 6 is to prevent the detection lines at both ends of the grounding monitoring device from being short-circuited caused by the metal casing of the grounding electrode, ensuring that a loop is formed by the detection lines at both ends via the ground in the case of reliable grounding and the loop is cut off if the grounding electrode is floating.

Figure 7:
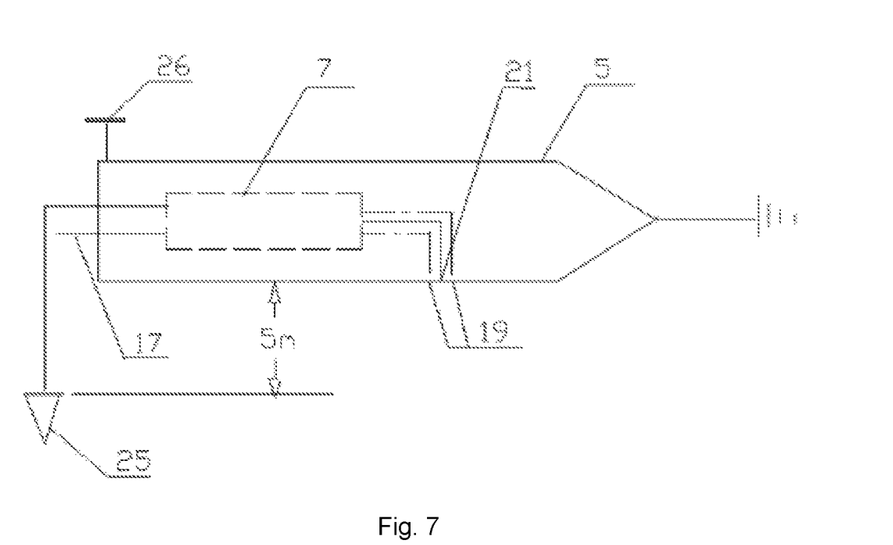
FIG. 7 illustrates a schematic block diagram of a grounding monitoring device of a grounding grid of some embodiments of the present disclosure.

FIG. 7 illustrates a schematic block diagram of a grounding monitoring device of a grounding grid of some embodiments of the present disclosure.

As shown in FIG. 7, the measurement power source of the grounding monitoring device 7 can be replaced by a dry battery, integrally encapsulated using an insulating material such as epoxy resin, and mounted in a hollow portion of the tubular grounding electrode 5. The outlet wire 21 of the grounding monitoring device 7 is connected to the metal casing of the grounding electrode, and can be provided with an insulating sheath 19 to avoid short circuit. The outlet wire at the other end of the grounding monitoring device 7 can be connected to a dedicated grounding electrode 25 for grounding test, which is 5 m (meters) away from the grounding electrode. The signal output line 17 is connected to a monitoring protection facility, and transmits signals such as grounding resistance measurement value or the relay operation signals to the monitoring protection facility in a wired or wireless manner for real-time online monitoring of the grounding resistance of the grounding electrode. If the grounding electrode is connected to a grounding grid 26, the grounding resistance of the grounding grid at this location can be monitored, and alarm, power-off, and locking (i.e., the device whose grounding resistance does not meet the requirement will not be powered) operations can be performed if necessary. The grounding electrode 5 may also be a grounding plate, and in this case the grounding monitoring device 7 may be mounted outside the grounding plate.

In summary, the embodiments of the present disclosure realize float locking of the leakage test grounding electrode of the leakage protection device. Therefore, when a remote leakage test is performed underground or on the ground, even if no one checks on the site whether the grounding electrode is floating, the hidden danger of electric sparks caused by a floated grounding electrode will not occur. That is to say, the embodiments of the present disclosure realize monitoring intelligence, improve the safety and reliability of the grounding protection, and have a contribution to underground safety.

Figure 8:
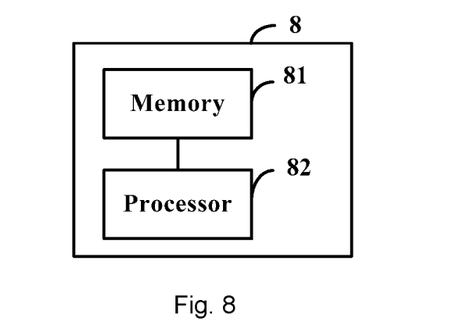
FIG. 8 illustrates an exemplary block diagram of a grounding monitoring device of some embodiments of the present disclosure.

FIG. 8 illustrates an exemplary block diagram of a grounding monitoring device of some embodiments of the present disclosure.

As shown in FIG. 8, the device 8 of this embodiment comprises: memory 81 and a processor 82 coupled to the memory 81, the processor 82 configured to, based on instructions stored in the memory 81, carry out the grounding monitoring method according to any one of the embodiments.

The memory 81 may comprise, for example, system memory, a fixed non-volatile storage medium, or the like. The system memory stores, for example, an operating system, application programs, a boot loader, a database, and other programs.

In some embodiments, a computer readable storage medium is provided having stored thereon a computer program that, when executed by a processor, implements the grounding monitoring method of any one of the above embodiments. For example, the computer readable storage medium is a non-transitory computer readable storage medium.

Figure 9:
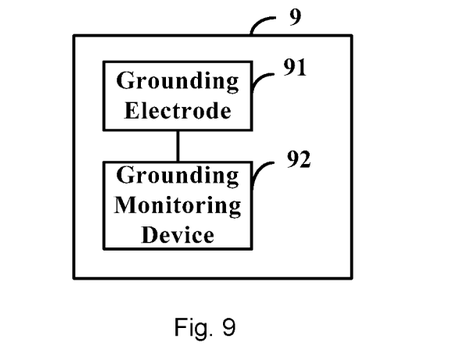
FIG. 9 illustrates an exemplary block diagram of a grounding monitoring system of some embodiments of the present disclosure.

FIG. 9 illustrates an exemplary block diagram of a grounding monitoring system of some embodiments of the present disclosure.

As shown in FIG. 9, the grounding monitoring system 9 comprises a grounding electrode 91 and a grounding monitoring device 92. The grounding monitoring device 92 may be the grounding monitoring device of any one of the above embodiments.

Heretofore, the grounding monitoring device, the grounding monitoring method, the grounding monitoring system, and the computer readable storage medium according to the present disclosure have been described in detail. In order to avoid obscuring the concepts of the present disclosure, some details known in the art are not described. Based on the above description, those skilled in the art can understand how to implement the technical solutions disclosed herein.

The method and system of the present disclosure may be implemented in many ways. For example, the method and system of the present disclosure may be implemented by software, hardware, firmware, or any combination of software, hardware, and firmware. The above sequence of steps of the method is merely for the purpose of illustration, and the steps of the method of the present disclosure are not limited to the above-described specific order unless otherwise specified. In addition, in some embodiments, the present disclosure may also be implemented as programs recorded in a recording medium, which comprise machine-readable instructions for implementing the method according to the present disclosure. Thus, the present disclosure also covers a recording medium storing programs for executing the method according to the present disclosure.

So far, the various embodiments of this disclosure have been described in detail. In order to avoid shielding the idea of this disclosure, some of the details well known in the art are not described. Those skilled in the art can fully understand how to carry out the technical solutions disclosed herein according to the above description.

Although some specific embodiments of this disclosure have been described in detail by way of examples, those skilled in the art should understand that the above examples are for illustrative purposes only, but not for limiting the scope of this disclosure. Those skilled in the art should understand that the above embodiments can be modified or some technical features can be equivalently replaced without departing from the scope and spirit of this disclosure. The scope of this disclosure is limited by the attached claims.

What is claimed is:

1. A grounding monitoring device, comprising:
   a measurement power source for supplying power to the grounding monitoring device;
   a resistance measurement device connected between the measurement power source and a grounding electrode, wherein the resistance measurement device, the measurement power source and the grounding electrode form a current detection circuit via the ground, and wherein a resistance of a grounding resistor is determined according to a current flowing through the grounding electrode in the current detection circuit to determine a monitoring result; and
   an operation mechanism for performing power on or off control on a power supply circuit of a grounding test device, wherein the operation mechanism is a relay with a normally closed contact which is connected to the power supply circuit of the grounding test device, the operation mechanism disconnecting the power supply circuit of the grounding test device by disconnecting the normally closed contact, if it is determined that the grounding electrode is not reliably grounded.

2. The grounding monitoring device according to claim 1, wherein the grounding monitoring device transmits the monitoring result comprising the resistance of the grounding resistor to a monitoring protection facility.

3. The grounding monitoring device according to claim 1, further comprising:
   a processor for determining whether the grounding electrode is reliably grounded according to the resistance of the grounding resistor or the current flowing through the grounding electrode determined by the resistance measurement device, wherein the processor generates an alarm signal or a power-off signal for transmission to a monitoring protection facility, if it is determined that the grounding electrode is not reliably grounded.

4. The grounding monitoring device according to claim 3, wherein the operation mechanism connected between the measurement power source and the resistance measurement device.

5. The grounding monitoring device according to claim 4, wherein if the processor determines that the grounding electrode is not reliably grounded, the processor disconnects the power supply circuit of the grounding test device by disconnecting the normally closed contact of the operation mechanism.

6. The grounding monitoring device according to claim 1, wherein:
the grounding electrode is a tubular grounding electrode;
the measurement power source and the resistance measurement device are mounted in a hollow portion of the tubular grounding electrode.

7. The grounding monitoring device according to claim 4, wherein the measurement power source, the operation mechanism, and the resistance measurement device are encapsulated by an insulating material.

8. A grounding monitoring method, comprising:
connecting a resistance measurement device to a measurement power source and a grounding electrode, wherein the measurement power source, the resistance measurement device and the grounding electrode form a current detection circuit via the ground;
determining a resistance of a grounding resistor to determine a monitoring result through monitoring a current flowing through the grounding electrode in the current detection circuit by the resistance measurement device; and
disconnecting a power supply circuit of a grounding test device by disconnecting a normally closed contact of an operation mechanism, if it is determined that the grounding electrode is not reliably grounded, the normally closed contact of the operation mechanism being connected to the power supply circuit of the grounding test device in series, wherein the operation mechanism is a relay.

9. The grounding monitoring method according to claim 8, further comprising:
transmitting the monitoring result including the resistance of a grounding resistor to a monitoring protection facility.

10. The grounding monitoring method according to claim 8, wherein the grounding electrode is a tubular grounding electrode, the measurement power source and the resistance measurement device are mounted in a hollow portion of the tubular grounding electrode.

11. The grounding monitoring method according to claim 8, further comprising:
determining whether the grounding electrode is reliably grounded according to the resistance of the grounding resistor or the current flowing through the grounding electrode;
wherein an alarm signal or a power-down signal is generated for transmission to a monitoring protection facility, if it is determined that the grounding electrode is not reliably grounded.

12. The grounding monitoring method according to claim 11, wherein the measurement power source, the operation mechanism, and the resistance measurement device are encapsulated by an insulating material.

13. A grounding monitoring device, comprising:
memory; and
a processor coupled to the memory, the processor configured to, based on instructions stored in the memory, carry out the grounding monitoring method according to claim 8.

14. A computer-readable storage medium on which a computer program is stored, which when executed by a processor implements the grounding monitoring method according to claim 8.

15. A grounding monitoring system, comprising:
a grounding electrode amounted in a power supply circuit of a grounding test device; and
a grounding monitoring device comprising:
a measurement power source for supplying power to the grounding monitoring device;
a resistance measurement device connected between the measurement power source and a grounding electrode, wherein the resistance measurement device, the measurement power source and the grounding electrode form a current detection circuit via the ground, and wherein a resistance of a grounding resistor is determined according to a current flowing through the grounding electrode in the current detection circuit to determine a monitoring result; and
an operation mechanism for performing power on or off control on the power supply circuit of the grounding test device, wherein the operation mechanism is a relay with a normally closed contact which is connected to the power supply circuit of the grounding test device, the operation mechanism disconnecting the power supply circuit of the grounding test device by disconnecting the normally closed contact, if it is determined that the grounding electrode is not reliably grounded.

16. The grounding monitoring system according to claim 15, wherein the grounding monitoring device transmits the monitoring result comprising the resistance of the grounding resistor to a monitoring protection facility.

17. The grounding monitoring system according to claim 15, wherein the grounding monitoring device further comprises:
a processor for determining whether the grounding electrode is reliably grounded according to the resistance of the grounding resistor or the current flowing through the grounding electrode determined by the resistance measurement device, wherein the processor generates an alarm signal or a power-off signal for transmission to a monitoring protection facility, if it is determined that the grounding electrode is not reliably grounded.

18. The grounding monitoring system according to claim 17, wherein if the processor determines that the grounding electrode is not reliably grounded, the processor disconnects the power supply circuit of the grounding test device by disconnecting the normally closed contact of the operation mechanism.

19. The grounding monitoring system according to claim 15, wherein the grounding electrode is a tubular grounding electrode or a ground plate, and wherein the measurement power source and the resistance measurement device are mounted in a hollow portion of the tubular grounding electrode.

* * * * *